(12) United States Patent
Baek

(10) Patent No.: US 7,767,521 B2
(45) Date of Patent: Aug. 3, 2010

(54) CELL REGION LAYOUT OF SEMICONDUCTOR DEVICE AND METHOD OF FORMING CONTACT PAD USING THE SAME

(75) Inventor: Cheol-ho Baek, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/565,801

(22) Filed: Sep. 24, 2009

(65) Prior Publication Data

US 2010/0015767 A1     Jan. 21, 2010

Related U.S. Application Data

(62) Division of application No. 11/395,855, filed on Mar. 31, 2006, now Pat. No. 7,615,815.

(30) Foreign Application Priority Data

Apr. 12, 2005    (KR)  .................... 10-2005-0030430

(51) Int. Cl.
    *H01L 21/8242*    (2006.01)
    *H01L 21/20*    (2006.01)

(52) U.S. Cl. ...................... 438/253; 438/256; 438/396; 438/399

(58) Field of Classification Search ......... 438/253–256, 438/393–399, E27.086
See application file for complete search history.

(56) References Cited

U.S. PATENT DOCUMENTS 5,783,336 A    7/1998   Aoki et al.
7,488,644 B2 *   2/2009   Lee et al. .................... 438/253

FOREIGN PATENT DOCUMENTS

| JP | 2000-19709 | | 1/2000 |
| KR | 2000-0015029 | A | 3/2000 |
| KR | 2001-0060441 | A | 7/2001 |

* cited by examiner

*Primary Examiner*—Cuong Q Nguyen
(74) *Attorney, Agent, or Firm*—Mills & Onello, LLP

(57) ABSTRACT

A cell region layout of a semiconductor device formed by adding active regions in the outermost portion of a cell region, and a method of forming a contact pad using the same are provided. The layout and the method include a first active region formed at the outermost portion of the cell region, and having the same shape as that of an inner active region located inwardly from the outermost portion of the cell region, and a third active region formed by adding at least two second active regions having shapes different from that of an inner active region. Further, an insulating layer fills a portion below a bit line passing the third active region. A lifting phenomenon occurring where an active region is not formed can be prevented by adding the active regions at the outermost portion of the cell region, and a bridge phenomenon occurring when bit lines or a bit line contact and a gate line electrically contact can be suppressed by filling a portion below a bit line with an insulating layer.

14 Claims, 9 Drawing Sheets

CELL REGION LAYOUT OF SEMICONDUCTOR DEVICE AND METHOD OF FORMING CONTACT PAD USING THE SAME

CROSS-REFERENCE TO RELATED PATENT APPLICATION

This application is a divisional application of U.S. patent application Ser. No. 11/395,855, filed on Mar. 31, 2006, which claims the benefit of Korean patent application number 10-2005-0030430, filed on Apr. 12, 2005, in the Korean Intellectual Property Office, the contents of which applications are incorporated herein in their entirety by reference.

BACKGROUND OF THE INVENTION

1. Field of the Invention

The present invention relates to a semiconductor device and a method of fabricating the same, and more particularly, to a layout of an outermost cell region of a semiconductor device and a method of forming a contact pad using the same.

2. Description of the Related Art

With the development of highly integrated semiconductor devices in recent years, the size of a pattern in a cell region of the device has been reduced. Various resolving power technology such as a phase shift method or modified illumination method is employed in order to form a fine pattern. However, a pattern may be transferred at the outermost portion of a cell region with an undesirable result due to optical diffraction or interference.

FIG. 1 is a plan view illustrating a conventional layout including a cell region.

Referring to FIG. 1, a cell region "a" includes an active region defined by an isolation layer 10. An outermost portion of the cell region a is divided into a first outermost portion "c" and a second outermost portion "b". The first outermost portion c is disposed in parallel with a sense amplifier 22 spaced from the first outermost portion c by a predetermined distance. The second outermost portion b is disposed in parallel with a word line drive portion 20 spaced from the second outermost portion b by a predetermined distance. A corner of the cell region a is included in the first outermost portion c.

The first outermost portion c includes a first active region 14 having the same shape as that of an inner active region 12 disposed inwardly from the first outermost portion. Further, the first outermost portion c includes at least two second active regions 16a, 16b spaced from the first active region 14 and adjacent thereto by a predetermined distance, and having respective shapes different from that of the inner active region 12 disposed inwardly from the first outermost portion c.

An active region disposed at the outermost portion of the cell region a, specifically, an active region formed at the first outermost portion c, has an incomplete shape, as if the inner active region 12 is formed incompletely. Because of that, since the size of the second active regions 16a, 16b is smaller than that of the inner active region 12, the second active regions 16a, 16b on the mask cannot be transferred on the substrate appropriately. Furthermore, a lifting phenomenon may occur, in which the second active region patterned on the mask is not transferred on the substrate. The lifting phenomenon may also occur in the second outermost portion b.

FIG. 2 is a plan view illustrating a conventional method of forming a contact pad in a cell region.

Referring to FIG. 2, a gate line 30 extends to form an acute angle with the longitudinal direction of the inner active region 12. A bit line 36 meets the gate line 30 vertically, and contacts and passes a bit line contact pad 34. A lower electrode contact pad 32 is formed on the active region between the gate lines 30. However, there may occur a problem in which a contact pad to connect the bit line on the second active regions 16a, 16b, or a capacitor lower electrode is not formed well.

SUMMARY OF THE INVENTION

The present invention provides a cell region layout for ensuring proper formation of an active region in an outermost portion of a cell region.

The present invention also provides a method of forming a contact pad to form a reliable structure at an outermost portion of a cell region.

According to an aspect of the present invention, there is provided a cell region layout of a semiconductor device including a cell region having an active region or area defined by an isolation layer. The cell region layout includes a first active region formed at a first outer portion of the cell region, and having the same shape as that of an inner active region located inwardly from the first outer portion of the cell region. The cell region layout also includes a third active region formed at the outer portion of the cell region and adjacent to at least one end of the first active region by a predetermined distance, and formed by adding at least two second active regions having shapes different from that of the inner active region.

The outer portion of the cell region may include a first outermost portion disposed adjacent to a sense amplifier aligned in parallel with the outer portion and spaced therefrom by a predetermined distance. In the first outermost portion, the first active region and the third active region may alternately and repeatedly aligned.

The outermost portion of the cell region may include a second outermost portion adjacent to a word line drive portion aligned in parallel with and spaced from the outer portion by a predetermined distance. The second outermost portion may include a fifth active region having a shape different from that of the active region or area disposed inwardly from the outer portion.

According to another aspect of the present invention, there is provided a method of forming a contact pad of a semiconductor device including forming a first active region at an outer portion of a cell region where an active area defined by an isolation layer is formed, the first active region having the same shape as that of an inner active region disposed inwardly from the outer portion of the cell region, and concurrently, forming a third active region by adding at least two second active regions disposed in parallel with and adjacent to at least one end of the first active region at the outer portion of the cell region by a predetermined distance, the second active region having a shape different from that of the inner active region. The method includes forming a first bit line contact pad on the first active region and below a first bit line passing over the first active region, to be connected with the first bit line, and concurrently, forming an insulating layer on the third active region and below a second bit line passing over the third active region.

The operation of forming a first active region and a third active region may include sequentially forming a pad oxide layer and a nitride layer for a mask on the semiconductor substrate, forming a first photoresist pattern on the nitride layer for a mask to define the first and third active regions, removing the nitride layer for a mask and the pad oxide layer, using the first photoresist pattern as an etch mask, thereby forming a pattern for a mask exposing the semiconductor substrate, etching the semiconductor substrate as the shape of the pattern for a mask, thereby forming an isolation region, and filling the isolation region with an insulating layer for isolation, thereby forming an isolation layer.

Two lower electrode contact pads and one first bit line contact pad may be formed on the first active region of the first outermost portion.

Two lower electrode contact pads may be formed on the third active region. The operation of forming two lower electrode contact pads may include forming a gate line including a gate insulating layer and a gate electrode on the semiconductor substrate having the third active region, forming an interlayer insulating layer on the overall surface of the semiconductor substrate having the gate line formed thereon, forming a second photoresist pattern defining the two lower electrode contact pads on the interlayer insulating layer, removing the interlayer insulating layer using the second photoresist pattern as an etch mask, thereby forming a contact hole exposing the semiconductor substrate, and burying the contact hole with a conductive material, thereby forming the two lower electrode contact pads.

One lower electrode contact pad may be formed on the second active region. The operation of forming one lower electrode contact pad may include forming a gate line including a gate insulating layer and a gate electrode on the semiconductor substrate having the third active region, forming an interlayer insulating layer on the overall surface of the semiconductor substrate having the gate line formed thereon, forming a second photoresist pattern defining the one lower electrode contact pad on the interlayer insulating layer, removing the interlayer insulating layer using the second photoresist pattern as an etch mask, thereby forming a contact hole exposing the semiconductor substrate, and burying the contact hole with a conductive material, thereby forming the one lower electrode contact pad.

The outermost portion of the cell region may include a second outermost portion adjacent to a word line drive portion aligned in parallel with and spaced from the outermost portion by a predetermined distance.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

Embodiments of the present invention are directed to enlarging an active region by adding the active regions located in the outermost portion of a cell region (see FIGS. 3A and 3B), and filling a bit line with an insulating layer instead of a contact pad in order to prevent electrical connection between a bit line formed in the enlarged active region and a gate line (see FIGS. 4A through 4E).

Figure 1:
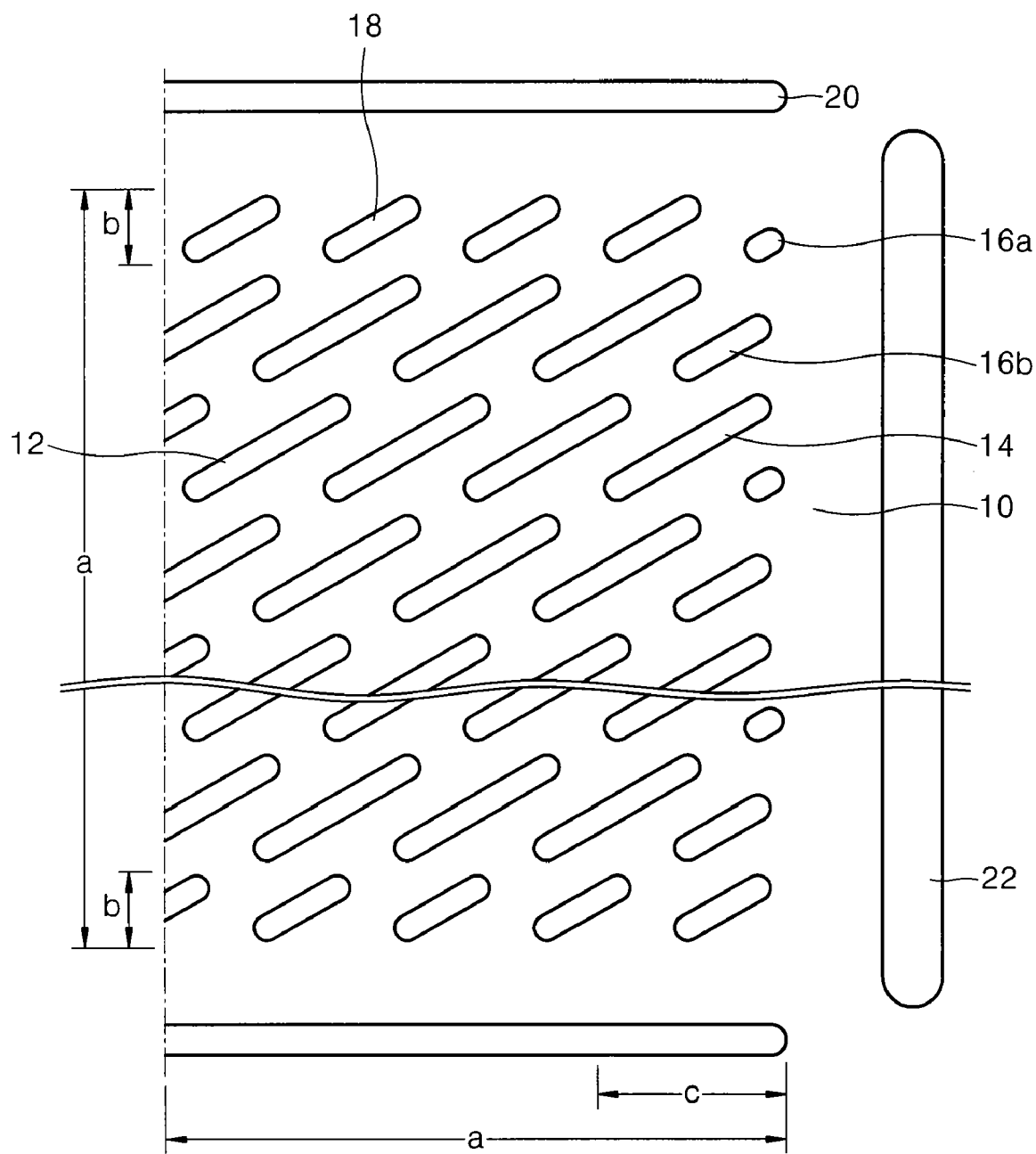
FIG. 1 is a plan view illustrating a conventional layout including a cell region.
Figure 2:
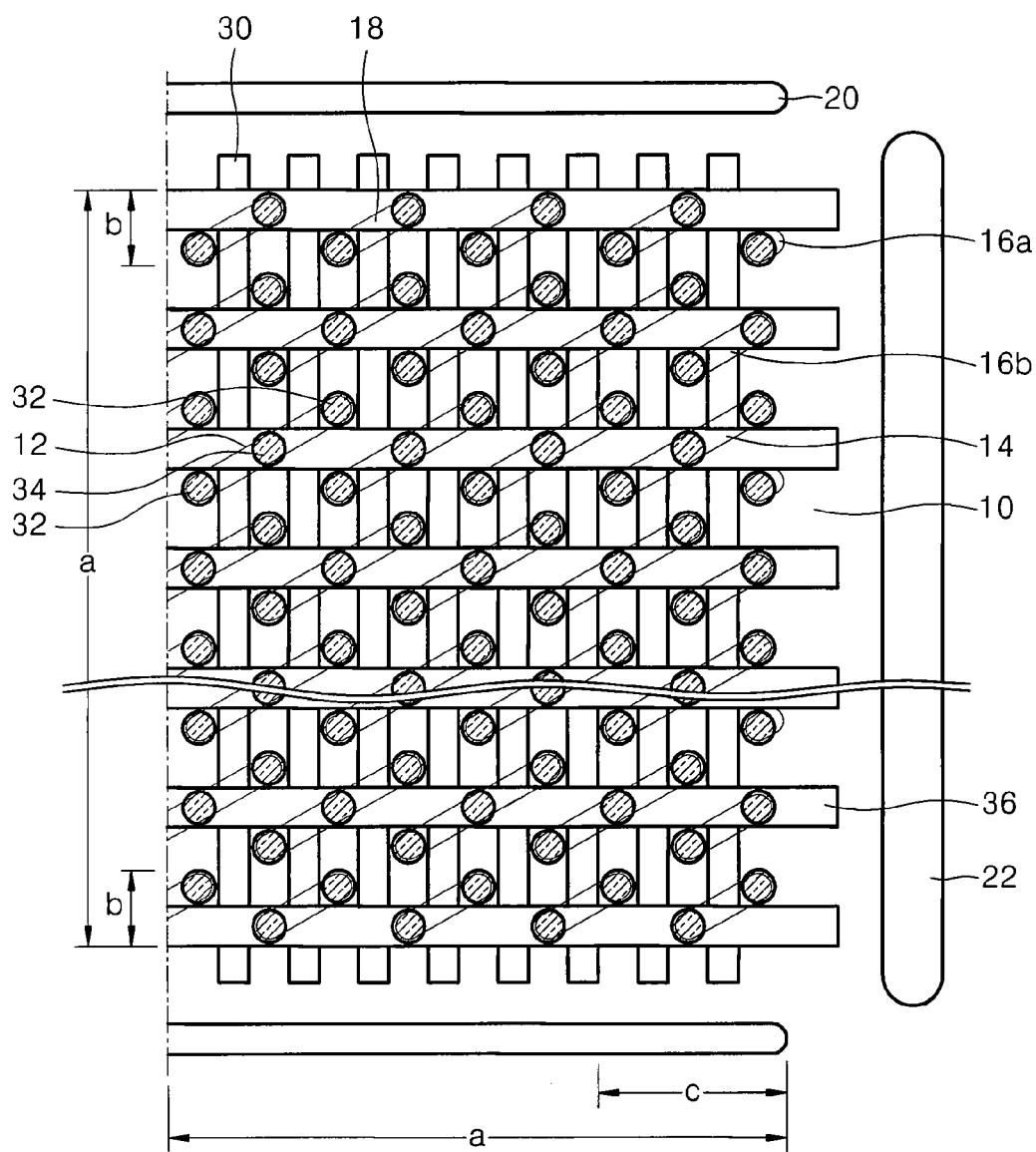
FIG. 2 is a plan view illustrating a conventional method of forming a contact pad in a cell region.
Figure 3A:
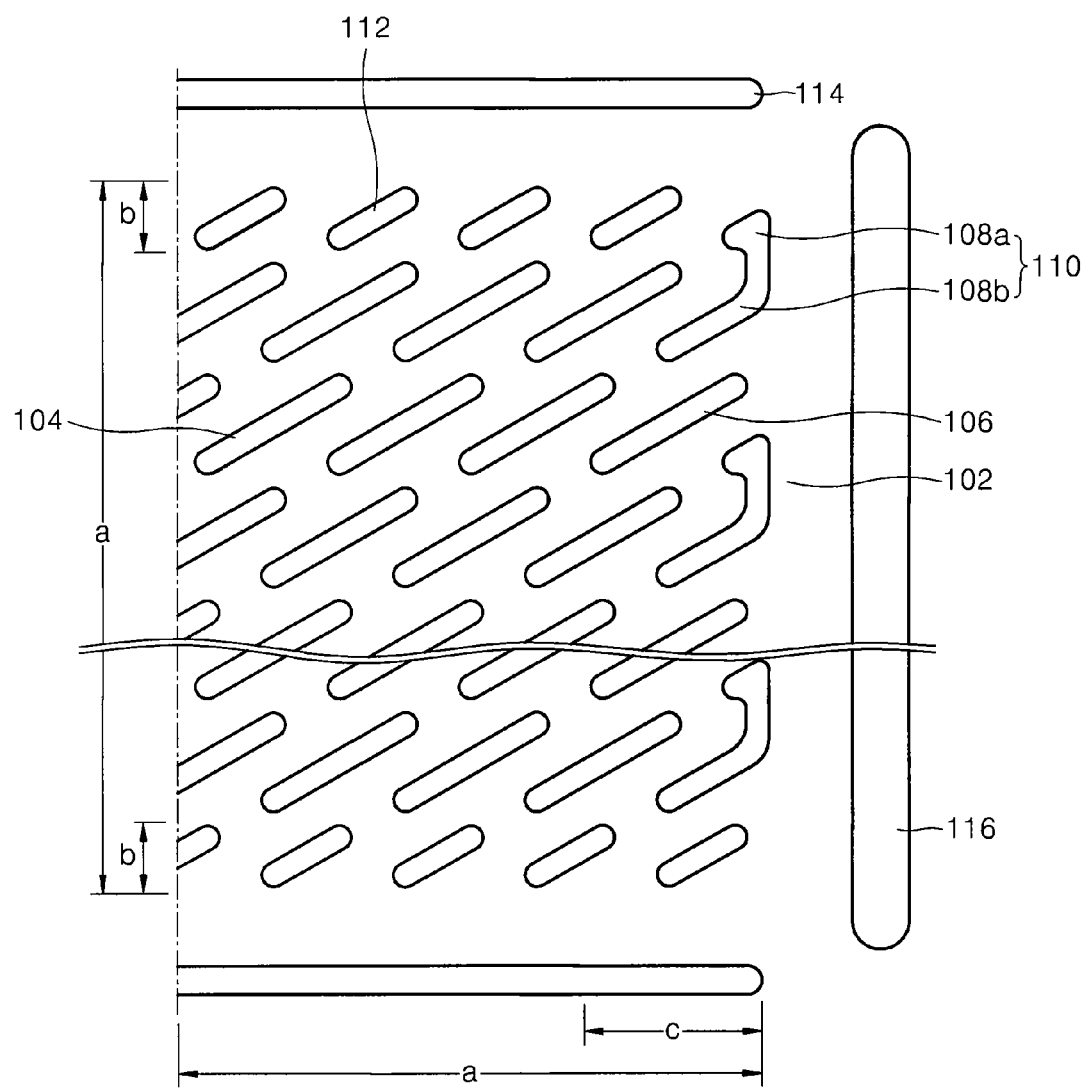
FIGS. 3A and 3B are plan views illustrating a layout including a cell region according to an embodiment of the present invention.
Figure 3B:
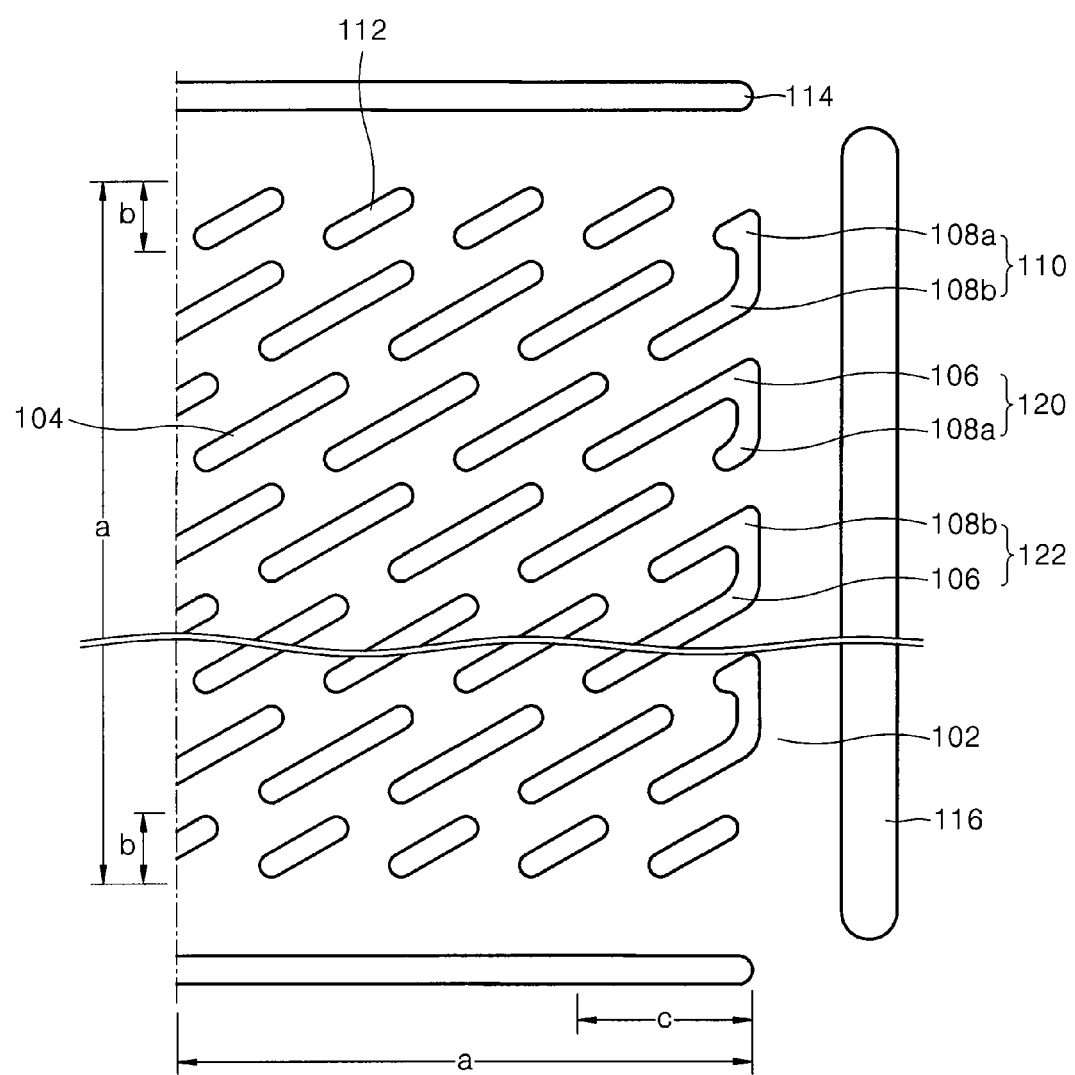

FIGS. 3A and 3B are plan views illustrating a layout including a cell region according to an embodiment of the present invention.

Referring to FIGS. 3A and 3B, a cell region a includes an active region or area defined by an isolation layer 102. An outermost portion of the cell region a is divided into a first outermost portion c and a second outermost portion b. The first outermost portion c is disposed in parallel with a sense amplifier 116 spaced from the first outermost portion c by a predetermined distance. The second outermost portion b is disposed in parallel with a word line drive portion 114 spaced from the second outermost portion b by a predetermined distance. A corner of the cell region a is included in the first outermost portion c.

The cell region a may include a plurality of active regions aligned on a straight line extending to form an acute angle with a gate line 130 (FIG. 4A) formed on the cell region a. Alternately, the cell region a may include active regions aligned in zig zag configuration on two adjacent straight lines extending to form an acute angle with a gate line 130 (FIG. 4A) formed on the cell region a.

The first outermost portion c includes a first active region 106 having the same shape as that of an inner active region 104 disposed inwardly from the first outermost portion c. Further, the first outermost portion c includes a third active region 110 disposed adjacent to the first active region 106 spaced from at least one end of the first active region 106 by a predetermined distance, and formed by adding at least two or more second active regions 108a, 108b having shapes different from that of the inner active region 104.

In the first active region 106 and the third active region 110, a pad oxide layer (not shown) and a nitride layer for a mask (not shown) are sequentially stacked on a semiconductor substrate 100. Then, a first photoresist pattern (not shown) is formed on the nitride layer for a mask to define the first and third active regions 106, 110. The nitride layer for a mask and the pad oxide layer are removed using the first photoresist pattern as an etch mask, thereby forming a pattern for a mask exposing the semiconductor substrate 100. The semiconductor substrate 100 is etched as the shape of the pattern for a mask, thereby forming an isolation region. The isolation region is filled with an insulating layer for isolation, thereby forming the isolation layer 102. The first outermost portion c may be aligned with the first active region 106 and the third active region 110, which are alternately repeatedly aligned.

Further, the first outermost portion c may include fourth active regions 120, 122, which are formed by adding the first active region 106 and each of the second active regions 108a, 108b. The second outermost portion b may include a fifth active region 112 having a different shape from that of the inner active region 104. At least one or more third active region 110 may be formed where the first outermost portion c and the second outermost portion b meet.

Figure 4A:
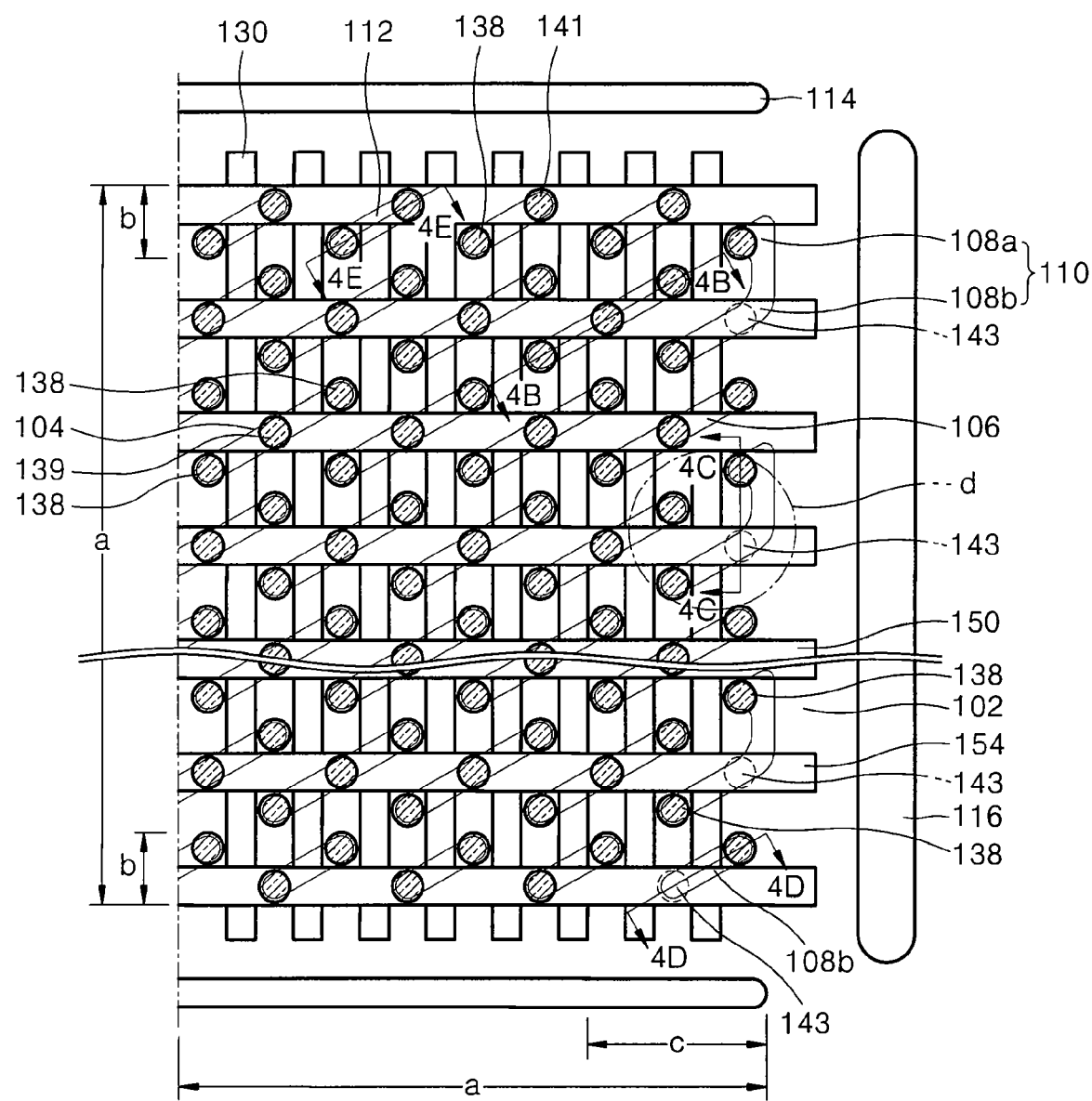
FIG. 4A is a plan view illustrating a method of forming a contact pad according to an embodiment of the present invention.

FIG. 4A is a plan view illustrating a method of forming a contact pad according to an embodiment of the present invention, and FIGS. 4B through 4E are sectional views taken along lines of 4B-4B, 4C-4C, 4D-4D, and 4E-4E, respectively, of FIG. 4A. A first bit line 150 passes a first active region 106 of a first outermost portion c having the same shape as that of an inner active region 104. A second bit line 154 passes an active region of the first outermost portion c, for example, the third active region 110, having a different shape from that of the inner active region 104. A cell region a where the first active region 106 and the third active region 110 are formed will be described in reference to FIGS. 4A through 4E.

Figure 4B:
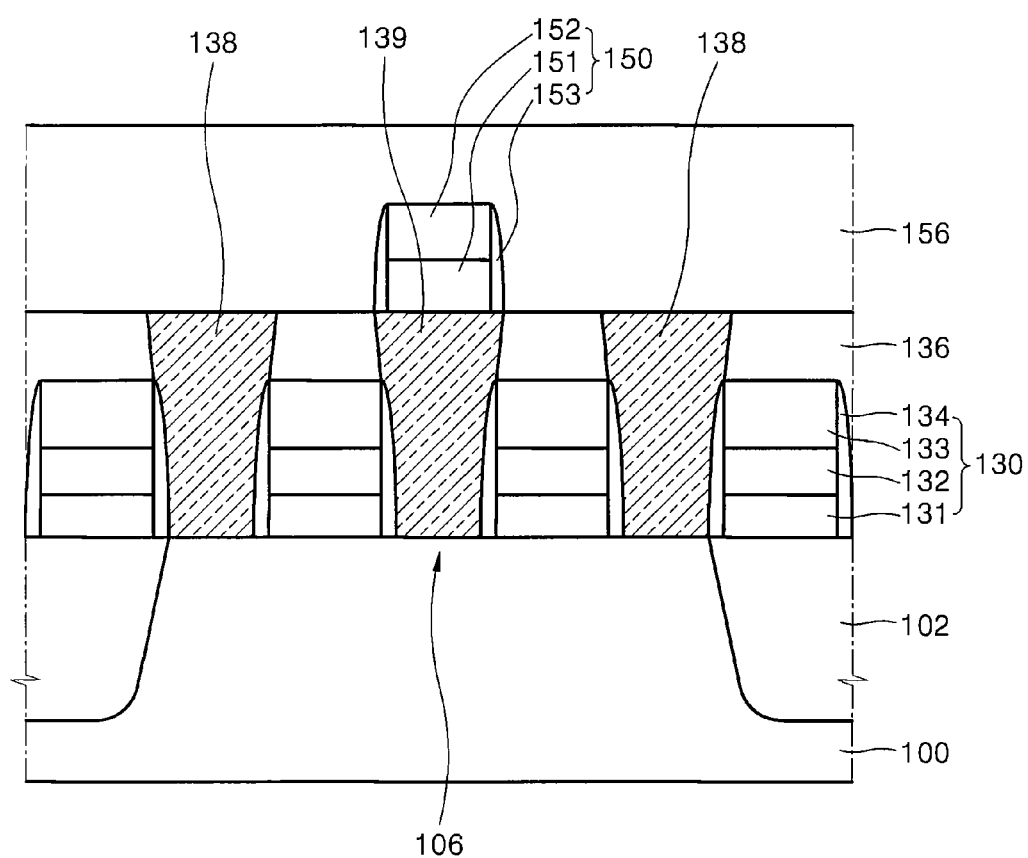
FIGS. 4B through 4E are sectional views taken along lines of 4B-4B, 4C-4C, 4D-4D, and 4E-4E, respectively, of FIG. 4A.

Referring to FIGS. 4A and 4B, two lower electrode contact pads 138 and one first bit line contact pad 139 are formed on the first active region 106 of the first outermost portion c. A gate line 130 including a gate insulating layer 131, a gate electrode 132, a capping layer 133, and a spacer 134 is formed on a semiconductor substrate 100 including the first active region 106 by a typical formation method. Then, a first interlayer insulating layer 136 is formed on the overall surface of the semiconductor substrate 100 having the gate line 130 formed thereon. A second photoresist pattern (not shown) defining two lower electrode contact pads 138 and a first bit line contact pad 139 is formed on the first interlayer insulating layer 136. The first interlayer insulating layer 136 is removed using the second photoresist pattern as an etch mask, thereby forming a contact hole exposing the semiconductor substrate 100. The contact hole is buried with a conductive material, thereby forming two lower electrode contact pads 138 and one first bit line contact pad 139.

Then, a first bit line 150 is formed on the first bit line contact pad 139. The first bit line 150 may be composed of a bit line material layer 151, a protecting layer 152, and a spacer 153. Then, a second interlayer insulating layer 156 is formed to cover the first bit line 150.

Figure 4C:
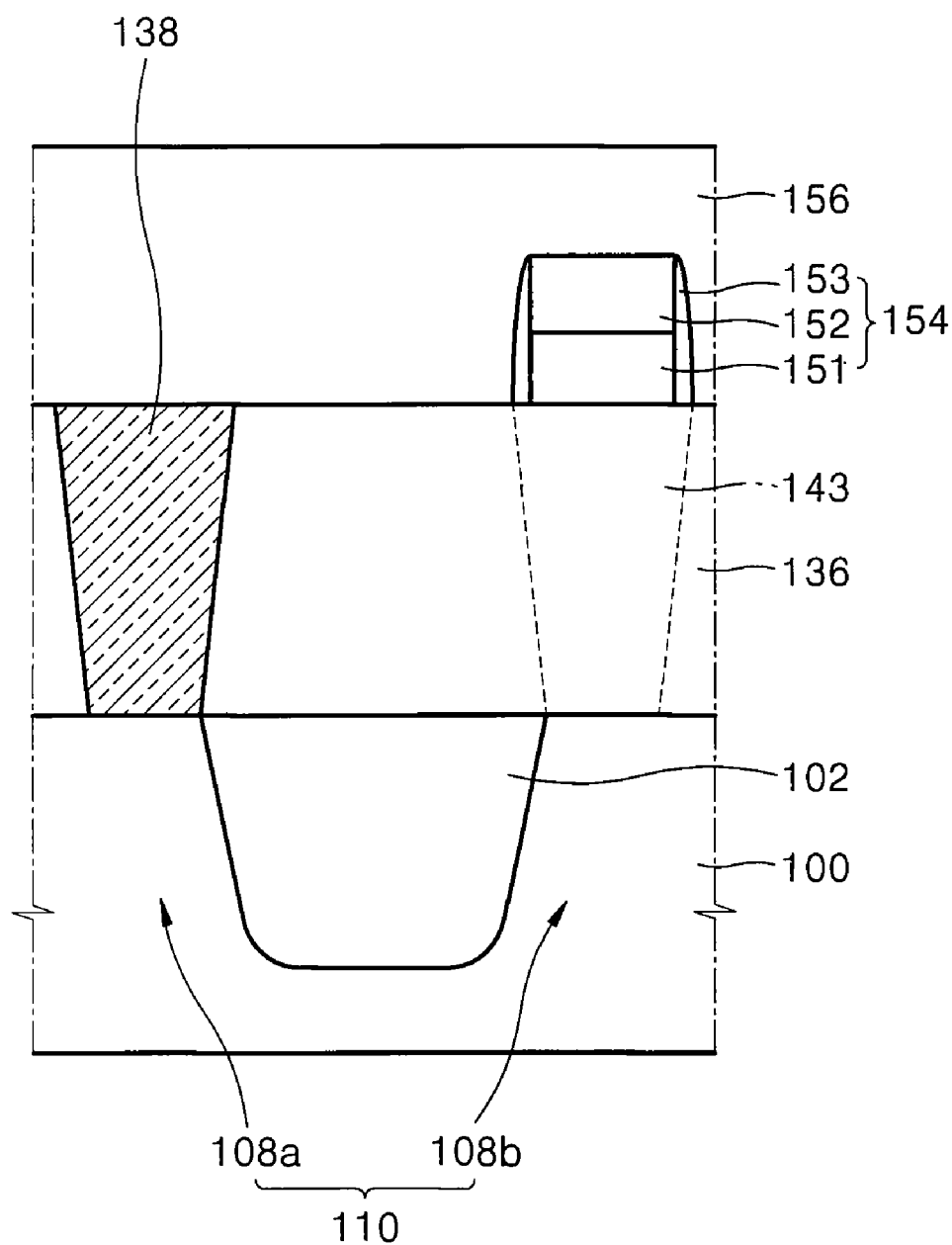

Referring to FIGS. 4A and 4C, two lower electrode contact pads 138 may be formed on the third active region 110. For convenience of description herein, a portion d including the third active region 110 is partially illustrated in section. A gate line 130 including a gate insulating layer and a gate electrode is formed on the semiconductor substrate 100 including the third active region 110. Then, a first interlayer insulating layer 136 is formed on the overall surface of the semiconductor substrate 100 having the gate line 130 formed thereon. A second photoresist pattern (not shown) defining two lower electrode contact pads 138 is formed on the first interlayer insulating layer 136. The first interlayer insulating layer 136 is removed using the second photoresist pattern as an etch mask, thereby forming a contact hole exposing the semiconductor substrate 100. The contact hole is buried with a conductive material, thereby forming two lower electrodes contact pads 138.

The contact pad is not formed below the second bit line 154, and a lower portion below the second bit line 154 is filled with the first interlayer insulating layer 136, so as to form a first interlayer insulating layer region 143. Then, a second bit line 154 is formed on the first interlayer insulating layer region 143. The second bit line 154 may be composed of a bit line material layer 151, a protecting layer 152, and a spacer 153. Then, a second interlayer insulating layer 156 is formed to cover the second bit line 154.

Figure 4D:
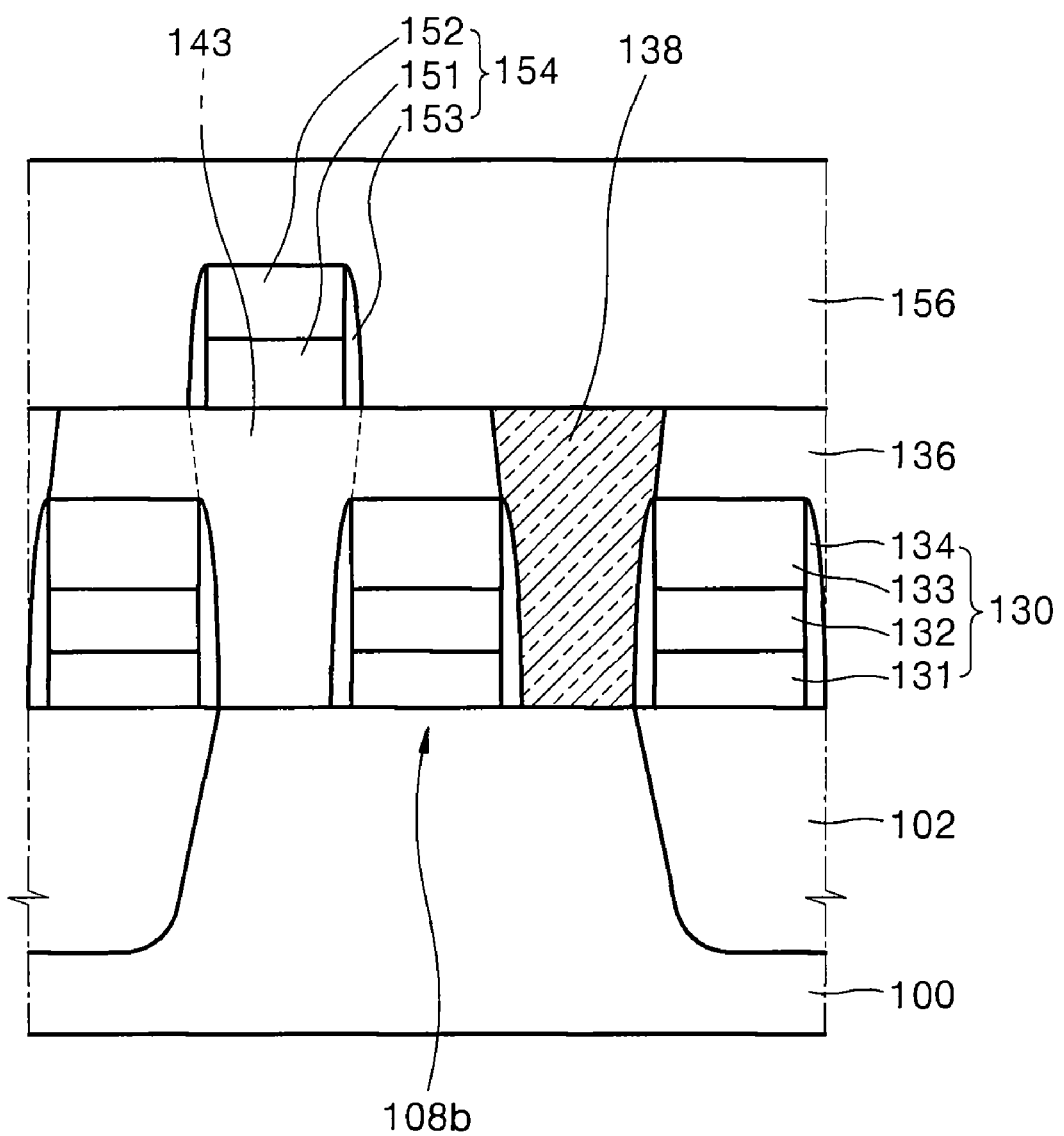

Referring to FIGS. 4A and 4D, one lower electrode contact pad 138 may be formed on the second active region 108b. A gate line 130 including a gate insulating layer and a gate electrode is formed on the semiconductor substrate 100 having the second active region 108b. A first interlayer insulating layer 136 is formed on the overall surface of the semiconductor substrate 100 having the gate line 130 formed thereon. A second photoresist pattern (not shown) defining one lower electrode contact pad 138 is formed on the first interlayer insulating layer 136. The first interlayer insulating layer 136 is removed using the second photoresist pattern as an etch mask, thereby forming a contact hole exposing the semiconductor substrate 100. The contact hole is buried with a conductive material, thereby forming one lower electrode contact pad 138.

The contact pad is not formed below the second bit line 154, and a lower portion below the second bit line 154 is filled with the first interlayer insulating layer 136, so as to form a first interlayer insulating layer region 143. In some cases, the first interlayer insulating layer region 143 may be filled with a conductive material, thereby forming a second bit line contact pad 141. Then, a second bit line 154 is formed on the first interlayer insulating layer region 143. The second bit line 154 may be composed of a bit line material layer 151, a protecting layer 152, and a spacer 153. Then, a second interlayer insulating layer 156 is formed to cover the second bit line 154.

Referring to FIGS. 4B through 4D, the second bit line contact pad 141 is not formed, but instead, the first interlayer insulating layer region 143 may be filled with the first interlayer insulating layer 136. The active region at the outermost portion of the added cell region a has an enlarged shape in comparison with an inner active region 104. Further, the active region has an incomplete shape in comparison with an inner active region 104. Because of that, if a second bit line contact pad is formed during a subsequent process, there may occur a bridge phenomenon in which electrical contact may be generated between bit lines or between a bit line and a gate line. Thus, if the second bit line contact pad is not formed, the bridge phenomenon may be prevented.

Figure 4E:
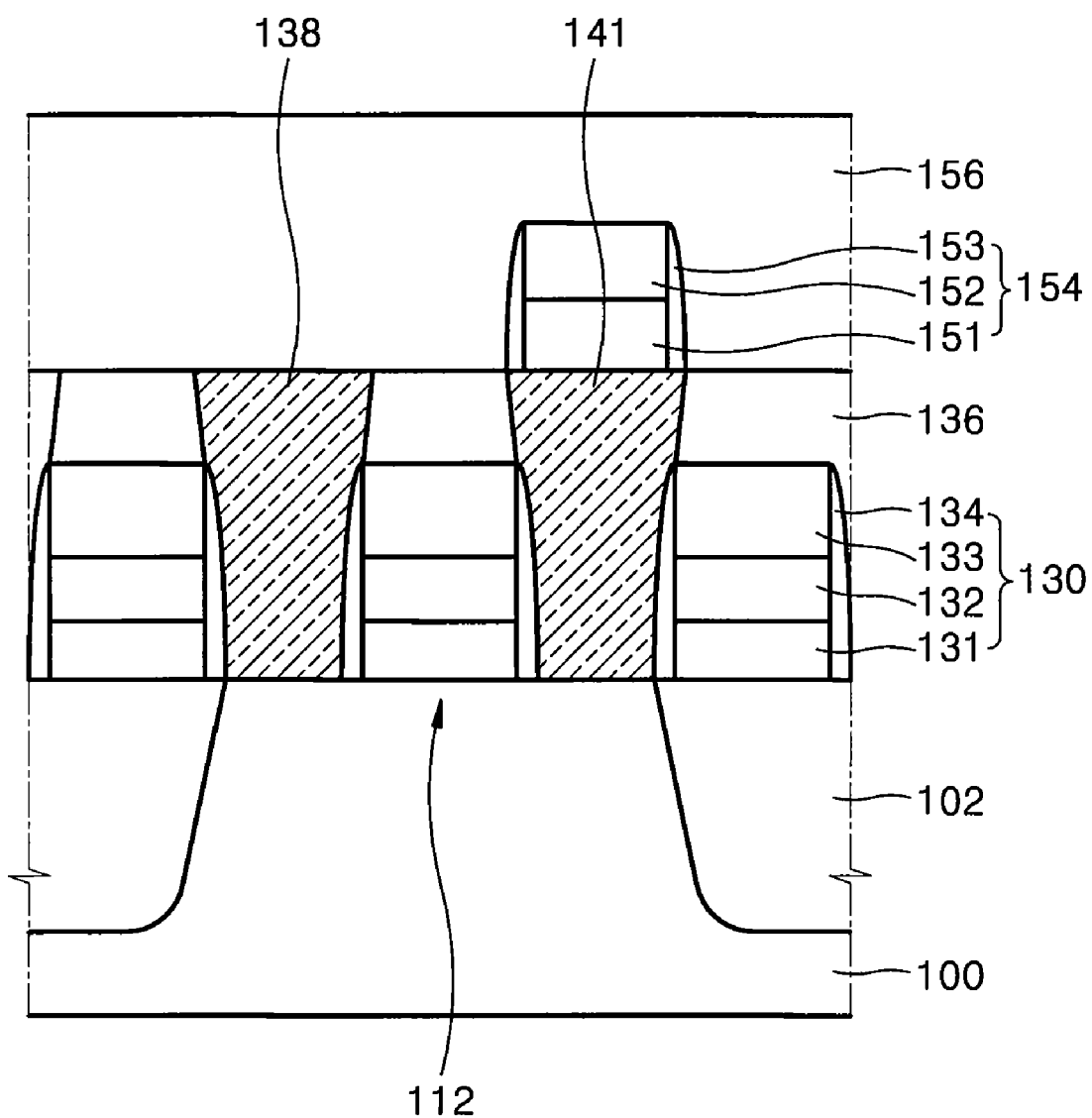

Referring to FIGS. 4A and 4E, a fifth active region 112 may be formed in a second outermost portion b, and the fifth active region 112 has a shape different from that of the active region 104 located inwardly from the second outermost portion b. One lower electrode contact pad 138 and one second bit line contact pad 141 may be formed on the fifth active region 112 by the same method as that of the contact pad formed on the first active region 106. In FIG. 4E, the second bit line contact pad 141 may not be formed in order to prevent the bridge phenomenon. Since the active region of the second outermost portion b is uniformly aligned in comparison with the active region of the first outermost portion c, the bridge phenomenon may not occur. Thus, the second bit line contact pad 141 may be formed on the active region of the second outermost portion b.

The second photoresist patterns used in FIGS. 4B through 4E are the same, and the contact pads may be formed concurrently.

As described above, in the cell region layout of a semiconductor device and a method of forming a contact pad according to the present invention, a lifting phenomenon, which may occur where an active region is not formed, can be prevented by adding active regions of the outermost portion of the cell region.

Further, a bridge phenomenon, which may occur due to electric contact between bit lines or between a bit line and a gate line, can be prevented by forming an insulating layer on the added active region of the outermost portion of the cell region instead of a bit line contact pad.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a contact pad of a semiconductor device comprising:

forming a first active region at an outer portion of a cell region where an active area defined by an isolation layer is formed, the first active region having the same shape as that of an inner active region disposed inwardly from the outer portion of the cell region;

concurrently, forming a third active region by adding at least two second active regions disposed in parallel with and adjacent to at least one end of the first active region at the outer portion of the cell region by a predetermined distance, the second active region having a shape different from that of the inner active region; and forming a first bit line contact pad on the first active region and below a first bit line passing over the first active region, to be connected with the first bit line;

concurrently, forming an insulating layer on the third active region and below a second bit line passing over the third active region.

2. The method according to claim 1, wherein the operation of forming a first active region and a third active region comprises:

sequentially forming a pad oxide layer and a nitride layer for a mask on the semiconductor substrate;

forming a first photoresist pattern on the nitride layer for a mask to define the first and third active regions;

removing the nitride layer for a mask and the pad oxide layer, using the first photoresist pattern as an etch mask, thereby forming a pattern for a mask exposing the semiconductor substrate;

etching the semiconductor substrate as the shape of the pattern for a mask, thereby forming an isolation region; and filling the isolation region with an insulating layer for isolation, thereby forming an isolation layer.

3. The method according to claim 1, wherein the outer portion of the cell region comprises a first outermost portion disposed adjacent to a sense amplifier aligned in parallel with the outer portion and spaced therefrom by a predetermined distance.

4. The method according to claim 3, wherein the first bit line and the second bit line are alternately and repeatedly aligned on the first outermost portion.

5. The method according to claim 3, further comprising forming two lower electrode contact pads and one first bit line contact pad on the first active region of the first outermost portion.

6. The method according to claim 5, wherein the operation of forming lower electrode contact pads and a first bit line contact pad comprises:

forming a gate line including a gate insulating layer and a gate electrode on the semiconductor substrate having the first active region;

forming an interlayer insulating layer on the overall surface of the semiconductor substrate having the gate line formed thereon;

forming a second photoresist pattern defining two lower electrode contact pads and one bit line contact pad on the interlayer insulating layer;

removing the interlayer insulating layer using the second photoresist pattern as an etch mask, thereby forming a contact hole exposing the semiconductor substrate; and burying the contact hole with a conductive material, thereby forming two lower electrode contact pads and one first bit line contact pad.

7. The method according to claim 3, wherein two lower electrode contact pads are formed on the third active region.

8. The method according to claim 7, wherein the operation of forming two lower electrode contact pads comprises:

forming a gate line including a gate insulating layer and a gate electrode on the semiconductor substrate having the third active region;

forming an interlayer insulating layer on the overall surface of the semiconductor substrate having the gate line formed thereon;

forming a second photoresist pattern defining the two lower electrode contact pads on the interlayer insulating layer;

removing the interlayer insulating layer using the second photoresist pattern as an etch mask, thereby forming a contact hole exposing the semiconductor substrate; and burying the contact hole with a conductive material, thereby forming the two lower electrode contact pads.

9. The method according to claim 3, wherein one lower electrode contact pad is formed on the second active region.

10. The method according to claim 9, wherein the operation of forming one lower electrode contact pad comprises:

forming a gate line including a gate insulating layer and a gate electrode on the semiconductor substrate having the third active region;

forming an interlayer insulating layer on the overall surface of the semiconductor substrate having the gate line formed thereon;

forming a second photoresist pattern defining the one lower electrode contact pad on the interlayer insulating layer;

removing the interlayer insulating layer using the second photoresist pattern as an etch mask, thereby forming a contact hole exposing the semiconductor substrate; and burying the contact hole with a conductive material, thereby forming the one lower electrode contact pad.

11. The method according to claim 3, wherein the first outermost portion comprises a fourth active region formed by adding the first active region and one of the second active regions.

12. The method according to claim 1, wherein the outermost portion of the cell region comprises a second outermost portion adjacent to a word line drive portion aligned in parallel with and spaced from the outer portion by a predetermined distance.

13. The method according to claim 12, wherein the second outermost portion comprises a fifth active region having a shape different from that of the active region disposed inwardly from the outer portion.

14. The method according to claim 13, wherein one lower electrode contact pad and one second bit line contact pad are formed on the fifth active region.

* * * * *